(12) United States Patent
Yasui

(10) Patent No.: US 7,388,401 B2
(45) Date of Patent: Jun. 17, 2008

(54) INPUT/OUTPUT CIRCUIT DEVICE

(75) Inventor: Takatoshi Yasui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 76 days.

(21) Appl. No.: 11/436,641

(22) Filed: May 19, 2006

(65) Prior Publication Data

US 2007/0008007 A1   Jan. 11, 2007

(30) Foreign Application Priority Data

Jul. 1, 2005   (JP)   ............................. 2005-193265

(51) Int. Cl.
*H03K 19/173*   (2006.01)
(52) U.S. Cl. ........................................ 326/47; 326/101
(58) Field of Classification Search .................. 326/82, 326/83, 86, 87, 101; 327/108, 109
See application file for complete search history.

(56) References Cited

U.S. PATENT DOCUMENTS 5,191,244 A * 3/1993 Runaldue et al. ............. 326/86
5,963,055 A * 10/1999 Tanaka et al. ................. 326/81
6,184,700 B1 * 2/2001 Morris ......................... 326/14
6,269,042 B1 * 7/2001 Kawano et al. .............. 365/226

FOREIGN PATENT DOCUMENTS

JP   5-227010 A   9/1993

* cited by examiner

*Primary Examiner*—James H Cho
(74) *Attorney, Agent, or Firm*—McDermott Will & Emery LLP

(57) ABSTRACT

An input/output circuit device includes a first transistor which is formed at a substrate, a first gate of which receives an input signal, one of a first source and drain of which is connected to a first power supply terminal, and the other of the first source and drain of which is connected to an internal node; and a second transistor which is formed at the substrate, a second gate of which is connected to a second power supply terminal, one of a second source and drain of which is connected to an input/output node, and the other of the second source and drain of which is connected to the internal node. The substrate of the second transistor has an electrically floating potential.

14 Claims, 4 Drawing Sheets

INPUT/OUTPUT CIRCUIT DEVICE

CROSS-REFERENCE TO RELATED APPLICATIONS

The disclosure of Japanese Patent Application No. 2005-193265 filed on Jul. 1, 2005 including specification, drawings and claims is incorporated herein by reference in its entirety.

BACKGROUND OF THE INVENTION (1) Field of the Invention

The present invention relates to input/output circuit devices, and more particularly relates to input/output circuit devices connected to semiconductor devices supplied with a higher power supply voltage than a predetermined operating voltage (design voltage).

(2) Description of Related Art

In recent years, with a sharp reduction in the size of complementary metal-oxide-semiconductor (CMOS) devices, the power supply voltage supplied to the CMOS device has been decreasing from 5 volts to 3.3 volts.

However, a plurality of electronic makers will never change the operating voltages of semiconductor devices from 5 volts to 3.3 volts in unison. It is impossible to change the operating voltages of all semiconductor devices to be connected to other semiconductor devices. Therefore, very large scale integrated circuit (VLSI) devices designed, for example, under the assumption that their operating voltage is 3.3 volts need to interface (make connection) with other semiconductor devices operating at a known operating voltage of 5 volts.

In order to interface between a semiconductor device designed to have an operating voltage of 3.3 volts and a semiconductor device designed to have an operating voltage of 5 volts, an input/output circuit or device for avoiding the adverse effect produced by the potential difference between the operating voltages is required. In other words, a further high-breakdown-voltage input/output circuit that can absorb the potential difference between the operating voltages is required, resulting in an increase in cost.

An input/output circuit device according to a known example will be described hereinafter with reference to FIG. 7. As illustrated in FIG. 7, a known input/output circuit device is composed of two cascaded n-type MOS transistors, a pull-down transistor Q1 and a cascade transistor Q2.

The gate of the pull-down transistor Q1 is connected to a signal terminal Vn to which a ground voltage Vss (=0 volt) or a power supply voltage VDD (=3.3 volts) is fed, the source thereof is grounded, and the drain thereof is connected to an internal node Vc. The gate of the cascade transistor Q2 is applied with a power supply voltage VDD, one of a source and a drain thereof is connected to the internal node Vc, and the other thereof is connected to an input/output terminal V0 applied with a voltage of 0 volt or 5 volts. The substrate potential of each of the pull-down transistor Q1 and the cascade transistor Q2 is grounded.

The pull-down transistor Q1 and the cascade transistor Q2 both usually represent transistors designed to operate at a drain-to-source voltage of 3.3 volts or less. However, in this known example, the transistors Q1 and Q2 are cascaded to each other so that the voltage applied to the input/output terminal V0, i.e., 5 volts, is divided by the transistors Q1 and Q2. This allows the application of a voltage of 5 volts to the input/output circuit device.

However, the known input/output circuit device causes the following problems when a voltage of 5 volts fed from the input/output terminal V0 is divided by the pull-down transistor Q1 and the cascade transistor Q2. In other words, when the source-to-drain voltages of the transistors Q1 and Q2 are equal to each other, the potential of the internal node Vc is approximately 2.5 volts. Therefore, the source voltage of the cascade transistor Q2 is approximately 2.5 volts. This allows the application of a substrate bias voltage, i.e., a substrate-to-source voltage of approximately 2.5 volts. As a result, the hot-carrier tolerance of the pull-down transistor Q2 is reduced, resulting in a significantly reduced reliability life of the input/output circuit device.

In order to reduce the substrate bias effect, the voltage applied from the input/output terminal V0 needs to be divided between the transistors to reduce the potential of the internal node Vc. In this case, the potential difference between the source and the drain of the cascade transistor Q2 (between the internal node Vc and the input/output terminal V0) increases, also resulting in a significant reduction in the hot-carrier tolerance.

SUMMARY OF THE INVENTION

The present invention is made in view of the above known problems, and its object is to allow an input/output circuit device through which semiconductor devices with different operating voltages are connected to each other to have a high breakdown voltage and exhibit a sufficient hot-carrier tolerance.

In order to achieve the above object, the present invention is configured such that an input/output circuit device includes a pull-down transistor (a first transistor) and a cascade transistor (a second transistor) and the substrate of the cascade transistor has a floating potential or the same potential as a connection node (internal node) between the transistors.

To be specific, an input/output circuit device according to a first aspect of the present invention includes: a first transistor formed at a substrate, a first gate of the first transistor receiving an input signal, one of a first source and drain thereof being connected to a first power supply terminal, and the other thereof being connected to an internal node; and a second transistor formed at the substrate, a second gate of the second transistor being connected to a second power supply terminal, one of a second source and drain thereof being connected to an input/output node, and the other thereof being connected to the internal node, wherein the substrate of the second transistor has an electrically floating potential.

According to the input/output circuit device of the first aspect, when the first transistor is operating, the voltage applied from the input/output node is divided by the resistances of the second transistor and the first transistor, leading to an increase in the potential of the internal node. Since in the device of the first aspect the substrate of the second transistor has a floating potential, this leads to coupling between the internal node and the second transistor. As a result, the substrate potential of the second transistor increases with an increase in the potential of the internal node. This reduces the substrate-to-source voltage of the second transistor. As a result, the hot-carrier tolerance can be restrained from being reduced.

An input/output circuit device according to a second aspect of the present invention includes: a first transistor formed at a substrate, a first gate of the first transistor receiving an input signal, one of a first source and drain thereof being connected to a first power supply terminal, and the other thereof being connected to an internal node; and a second transistor formed at the substrate, a second gate of the second transistor being connected to a second power supply terminal, one of a second source and drain thereof being connected to an input/output node, and the other thereof being connected to the internal node, wherein the substrate of the second transistor has the same potential as the internal node.

According to the input/output circuit device of the second aspect, when the first transistor is operating, the voltage applied from the input/output node is divided by the resistances of the second transistor and the first transistor, leading to an increase in the potential of the internal node. Since in the device of the second aspect the substrate of the second transistor has the same potential as the internal node, its potential increases with an increase in the potential of the internal node. This reduces the substrate-to-source voltage of the second transistor. As a result, the hot-carrier tolerance can be restrained from being reduced.

In the input/output circuit device of the first or second aspect, the substrate potential of the first transistor is preferably connected to the first power supply terminal.

It is preferable that in the input/output circuit device of the first or second aspect, a first conductivity type well is formed in the top surface of the substrate with the second source and drain and a second conductivity type well is formed to cover the side and lower surfaces of the first conductivity type well.

It is preferable that in the input/output circuit device of the first or second aspect, a first conductivity type well is formed in the top surface of the substrate with the second source and drain and an insulating film is formed to cover the side and lower surfaces of the first conductivity type well.

It is preferable that in the input/output circuit device of the first or second aspect, each of the first source and drain and the second source and drain has an n conductivity type, a ground voltage is applied to the first power supply terminal, and a power supply voltage is applied to the second power supply terminal.

DETAILED DESCRIPTION OF THE INVENTION

Embodiment 1

A first embodiment of the present invention will be described with reference to the drawings.

Figure 1:
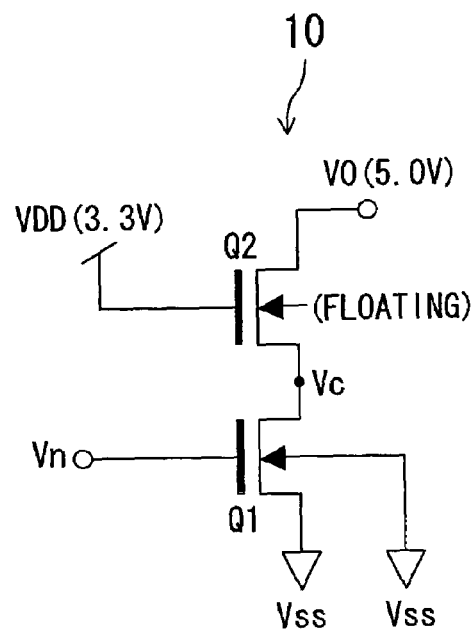
FIG. 1 is a circuit diagram illustrating an input/output circuit device according to a first embodiment of the present invention.

FIG. 1 is a circuit diagram of an input/output circuit device according to a first embodiment of the present invention. As illustrated in FIG. 1, an input/output circuit device 10 according to the first embodiment is composed of two cascaded n-type MOS transistors, a pull-down transistor Q1 (a first transistor) and a cascade transistor Q2 (a second transistor).

The gate of the pull-down transistor Q1 is connected to a signal terminal Vn to which a ground voltage Vss (=0 volt) or a power supply voltage VDD (=3.3 volts) is fed, the source thereof is grounded, and the drain thereof is connected to an internal node Vc. The gate of the cascade transistor Q2 is applied with a power supply voltage VDD, one of a source and a drain thereof is connected to the internal node Vc, and the other thereof is connected to an input/output terminal V0 applied with 0 volt or 5 volts.

The input/output circuit device of the first embodiment is characterized as follows: While the substrate potential of the pull-down transistor Q1 is grounded, the substrate of the cascade transistor Q2 has a floating potential. With this structure, when a power supply voltage VDD is applied to the gate of the pull-down transistor Q1 and thus the pull-down transistor Q1 is driven, this allows current to pass through an input/output terminal V0, the cascade transistor Q2, the internal node Vc, and the pull-down transistor Q1. Therefore, the voltage applied from the input/output terminal V0 is divided by the resistances of the cascade transistor Q2 and the pull-down transistor Q1, leading to an increase in the potential of the internal node Vc. Since in this embodiment the substrate of the cascade transistor Q2 has a floating potential, this leads to coupling (capacitive coupling) between the internal node Vc and the substrate of the cascade transistor Q2. As a result, the substrate potential of the cascade transistor Q2 increases with an increase in the potential of the internal node Vc. This reduces the substrate-to-source voltage of the cascade transistor Q2. As a result, the hot-carrier tolerance can be restrained from being reduced.

Example of First Structure

Figure 2:
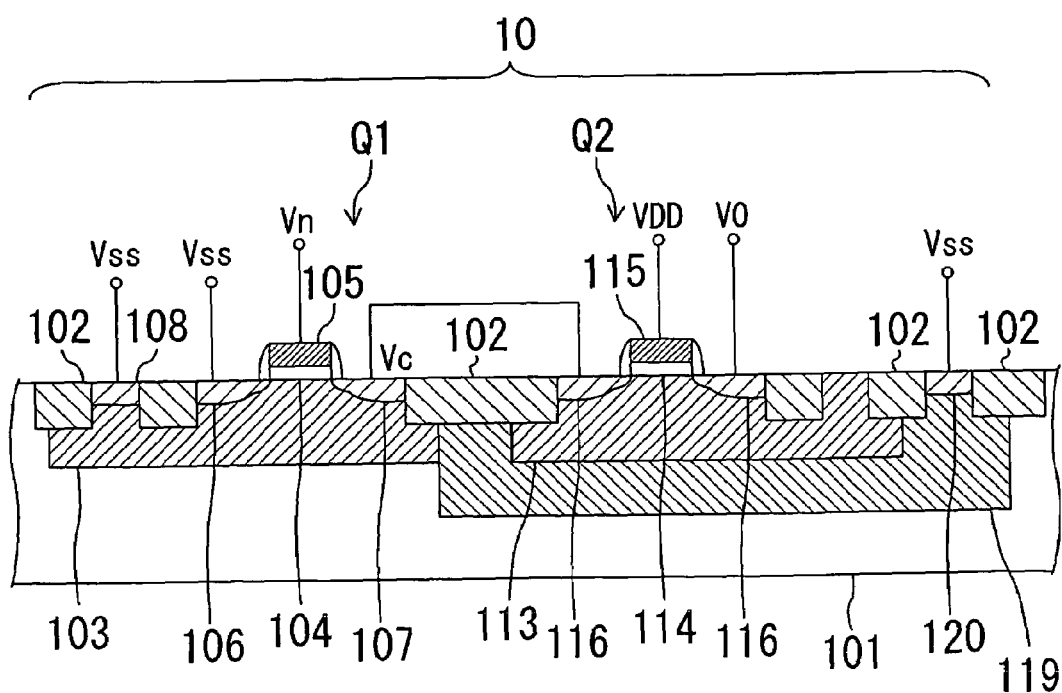
FIG. 2 is a cross-sectional view illustrating an example of a first structure of the input/output circuit device according to the first embodiment of the present invention.

FIG. 2 is a cross-sectional view illustrating an example of a first structure of the input/output circuit device 10 according to the first embodiment of the present invention. As illustrated in FIG. 2, in the input/output circuit device 10 of the example of the first structure, a pull-down transistor Q1 and a cascade transistor Q2 are formed at a first p-type well 103 and a second p-type well 113, respectively, defined by an isolation region 102 selectively formed in the upper part of a semiconductor substrate 101 of, for example, silicon (Si).

As illustrated in FIG. 2, The pull-down transistor Q1 includes a gate dielectric 104 and a gate electrode 105 successively formed on part of the first p-type well 103 and a source diffusion layer 106 and a drain diffusion layer 107 representing heavily-doped n-type impurity diffusion layers formed in parts of the upper part of the first p-type well 103 located to both lateral sides of the gate electrode 105. A heavily-doped p-type impurity diffusion layer 108 is formed in a part of the upper part of the first p-type well 103 closer to the outer lateral end thereof than the source diffusion layer 106, and a ground voltage Vss is applied, as the substrate potential, through the p-type impurity diffusion layer 108 to the first p-type well 103.

The cascade transistor Q2 includes a gate dielectric 114 and a gate electrode 115 successively formed on part of the second p-type well 113 and source/drain diffusion layers 116 representing heavily-doped n-type impurity diffusion layers formed in parts of the upper part of the second p-type well 113 located to both lateral sides of the gate electrode 115. The side and lower surfaces of the second p-type well 113 are covered with an n-type well 119 representing a lightly-doped n-type impurity diffusion layer, and a heavily-doped n-type impurity diffusion layer 120 is formed in a part of the upper part of the n-type well 119 near the outer lateral end thereof. A ground voltage Vss is applied through the n-type impurity diffusion layer 120 to the n-type well 119. A voltage to be applied to the n-type well 119 does not always need to be the ground voltage Vss. In a case where a p-type MOS transistor is formed at an n-type well to reduce the layout area, a power supply voltage VDD may be applied to the n-type well. The first p-type well 103 and the second p-type well 113 are electrically isolated from each other by the n-type well 119.

In view of the above, in the example of the first structure, the side surface of the second p-type well 113 formed with the cascade transistor Q2 is surrounded by the isolation region 102 and the n-type well 119, and the lower surface thereof is covered with the n-type well 119. Furthermore, the second p-type well 113 is electrically floating. Thus, an input/output circuit device 10 according to the first embodiment of the present invention can be achieved.

Example of Second Structure

Figure 3:
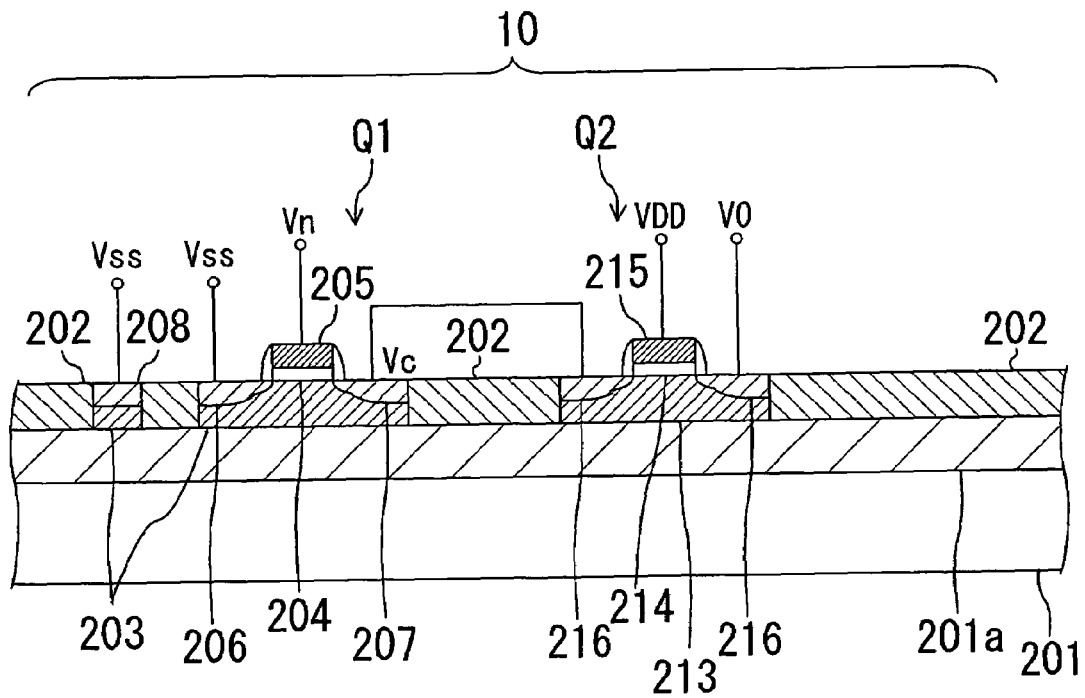
FIG. 3 is a cross-sectional view illustrating an example of a second structure of the input/output circuit device according to the first embodiment of the present invention.

FIG. 3 is a cross-sectional view illustrating an example of a second structure of an input/output circuit device 10 according to the first embodiment of the present invention. As illustrated in FIG. 3, in the input/output circuit device according to the example of the second structure, a pull-down transistor Q1 and a cascade transistor Q2 are formed at a first p-type well 203 and a second p-type well 213, respectively, defined by an isolation region 202 selectively formed in the upper part of a so-called silicon on insulator (SOI) substrate 201. An insulating layer 201a is formed in the SOI substrate 201 so as to be buried therein at a predetermined depth from the principal surface of the SOI substrate 201.

As illustrated in FIG. 3, The pull-down transistor Q1 includes a gate dielectric 204 and a gate electrode 205 successively formed on part of the first p-type well 203 and a source diffusion layer 206 and a drain diffusion layer 207 representing heavily-doped n-type impurity diffusion layers formed in parts of the upper part of the first p-type well 203 located to both lateral sides of the gate electrode 205. A heavily-doped p-type impurity diffusion layer 208 is formed in a part of the upper part of the first p-type well 203 closer to the outer lateral end thereof than the source diffusion layer 206. Although not illustrated, a so-called body contact structure allows the application of a ground voltage Vss as the substrate potential through the p-type impurity diffusion layer 208 to the first p-type well 203.

In view of the above, in the example of the second structure using the SOI substrate 201, the side surface of the second p-type well 213 formed with the cascade transistor Q2 is surrounded by the isolation region 202, and the lower surface thereof is covered with the insulating layer 201a. Furthermore, the second p-type well 213 is electrically floating. Thus, an input/output circuit device 10 according to the first embodiment of the present invention can be achieved.

Embodiment 2

A second embodiment of the present invention will be described hereinafter with reference to the drawings.

Figure 4:
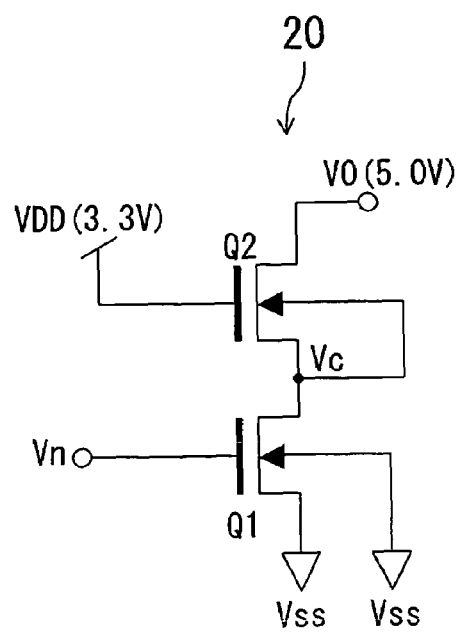
FIG. 4 is a circuit diagram illustrating an input/output circuit device according to a second embodiment of the present invention.

FIG. 4 is a circuit diagram of an input/output circuit device according to a second embodiment of the present invention. As illustrated in FIG. 4, an input/output circuit device 20 according to the second embodiment is composed of two cascaded n-type MOS transistors, a pull-down transistor Q1 (a first transistor) and a cascade transistor Q2 (a second transistor).

The input/output circuit device 20 of the second embodiment is different from that of the first embodiment as follows: While the substrate potential of the pull-down transistor Q1 is grounded, the cascade transistor Q2 is connected to an internal node Vc such that its substrate has the same potential as the internal node Vc. The substrate potential of the pull-down transistor Q1 does not always need to be grounded.

With this structure, when a power supply voltage VDD is applied to the gate of the pull-down transistor Q1 and thus the pull-down transistor Q1 is driven, this allows current to pass through an input/output terminal V0, the cascade transistor Q2, the internal node Vc, and the pull-down transistor Q1. Therefore, the voltage applied from the input/output terminal V0 is divided by the resistances of the cascade transistor Q2 and the pull-down transistor Q1, resulting in an increase in the potential of the internal node Vc. Since in this embodiment the substrate of the cascade transistor Q2 has the same potential as the internal node Vc, its potential increases simultaneously with an increase in the potential of the internal node Vc. This reduces the substrate-to-source voltage of the cascade transistor Q2. As a result, the hot-carrier tolerance can be restrained from being reduced.

Example of First Structure

Figure 5:
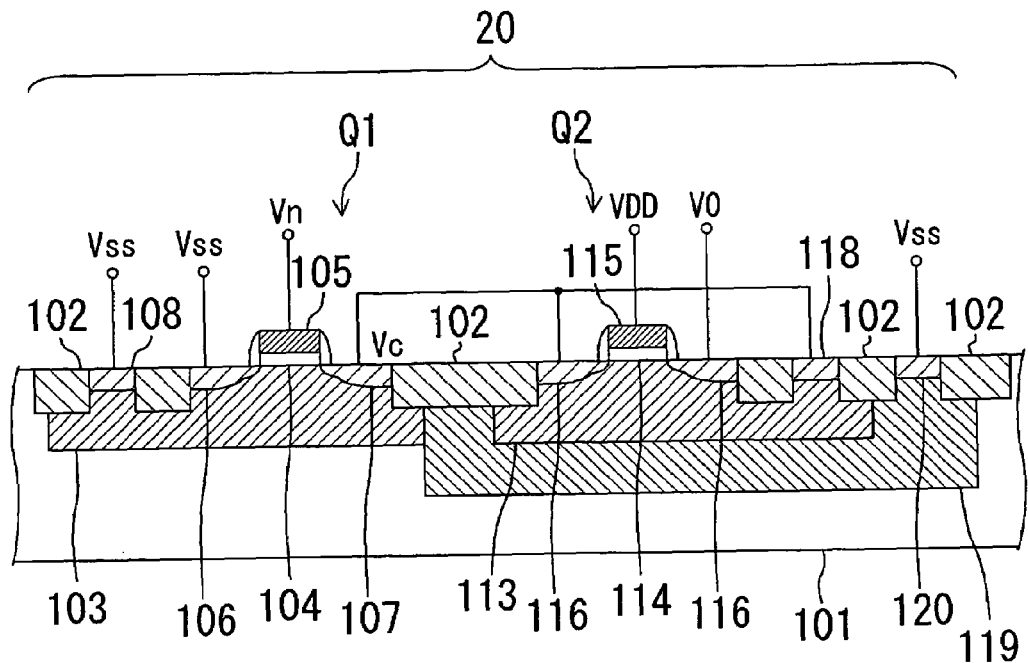
FIG. 5 is a cross-sectional view illustrating an example of a first structure of the input/output circuit device according to the second embodiment of the present invention.

FIG. 5 is a cross-sectional view illustrating an example of a second structure of the input/output circuit device 20 according to the second embodiment of the present invention. In FIG. 5, the same reference numerals are given to the same components as those in FIG. 2, and therefore a description thereof is not given. As illustrated in FIG. 5, in the input/output circuit device 20 of the example of the first structure, a heavily-doped p-type impurity diffusion layer 118 is formed in a part of the upper part of the second p-type well 113 near the outer lateral end thereof, and the p-type impurity diffusion layer 118 is connected to the internal node Vc. In this way, an input/output circuit device 20 according to the second embodiment of the present invention can be achieved.

Example of Second Structure

Figure 6:
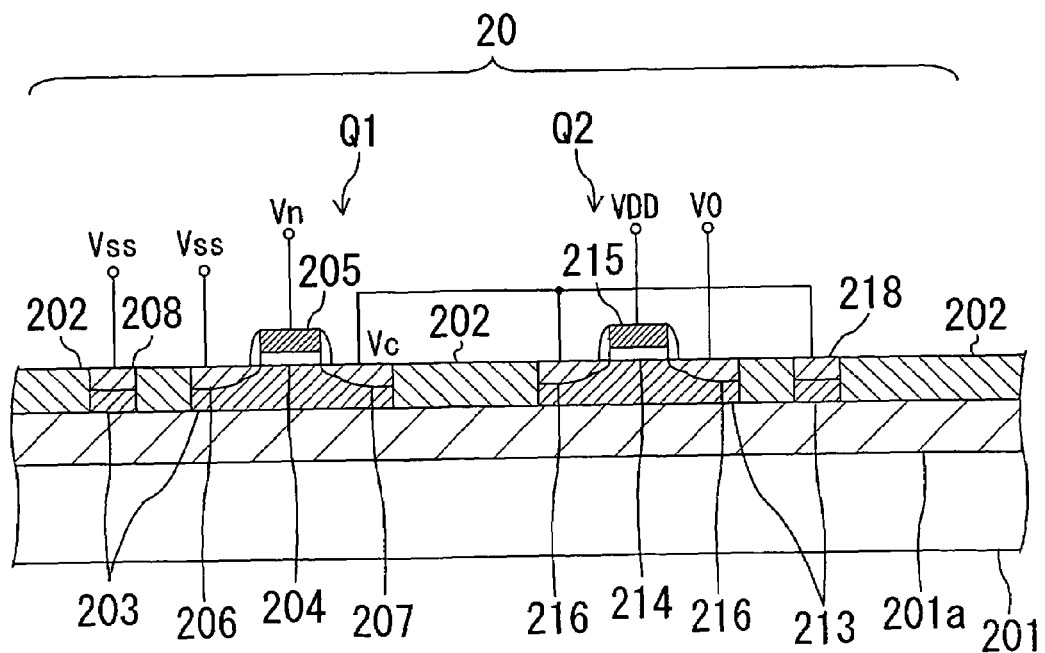
FIG. 6 is a cross-sectional view illustrating an example of a second structure of the input/output circuit device according to the second embodiment of the present invention.
Figure 7:
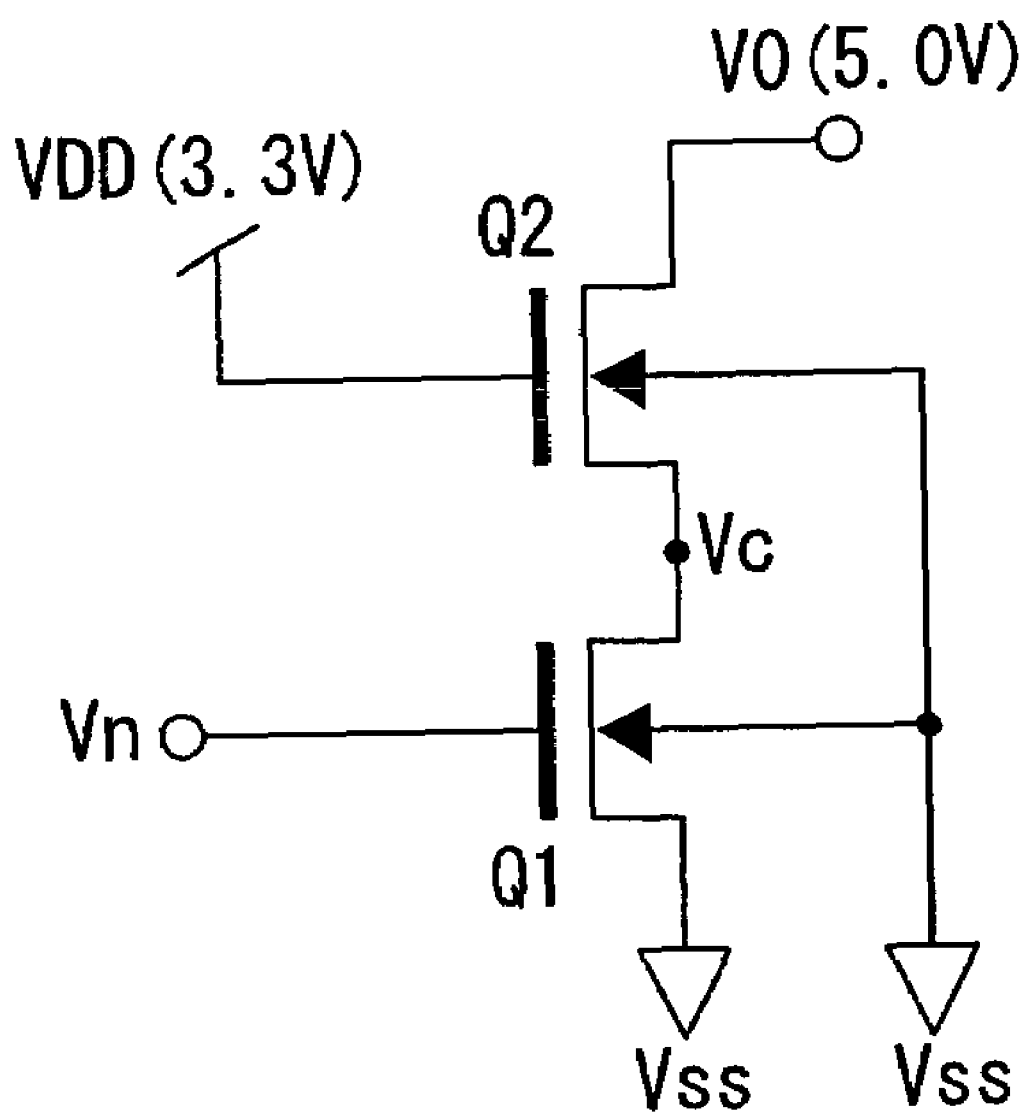
FIG. 7 is a circuit diagram illustrating an input/output circuit device for a CMOS device according to a known example.

FIG. 6 is a cross-sectional view illustrating an example of a second structure of the input/output circuit device 20 according to the second embodiment of the present invention. In FIG. 6, the same reference numerals are given to the same components as those in FIG. 3, and therefore a description thereof is not given. As illustrated in FIG. 6, in the input/output circuit device 20 of the example of the second structure, a heavily-doped p-type impurity diffusion layer 218 is formed in a part of the upper part of the second p-type well 213 near the outer lateral end thereof, and a so-called body contact structure allows connection between the p-type impurity diffusion layer 218 and the internal node Vc. In this way, an input/output circuit device 20 according to the second embodiment of the present invention can be achieved.

As described above, in the input/output circuit device according to the present invention, the substrate-to-source voltage of one (a second transistor) of two cascaded transistors which is connected to an input/output node is reduced. Therefore, the input/output circuit device according to the present invention is useful as an input/output circuit device which can suppress reduction in the hot-carrier tolerance while maintaining a high breakdown voltage and allows connection (interface) with a semiconductor device supplied with a higher power supply voltage than a predetermined operating voltage (design voltage).

What is claimed is:

1. An input/output circuit device comprising:
a first transistor formed at a substrate, a first gate of the first transistor receiving an input signal, one of a first source and drain thereof being connected to a first power supply terminal, and the other thereof being connected to an internal node; and
a second transistor formed at the substrate, a second gate of the second transistor being connected to a second power supply terminal, one of a second source and drain thereof being connected to an input/output node, and the other thereof being connected to the internal node,
wherein a first conductivity type well is formed in the top surface of the substrate with the second source and drain, and an insulating film is formed to cover the side and lower surfaces of the first conductivity type well, and
the first conductivity type well has an electrically floating potential.

2. The input/output circuit device of claim 1, wherein the potential of a well at which the first transistor is formed is connected to the first power supply terminal.

3. The input/output circuit device of claim 1, wherein each of the first source and drain and the second source and drain has an n conductivity type,
a ground voltage is applied to the first power supply terminal, and a power supply voltage is applied to the second power supply terminal.

4. An input/output circuit device comprising:
a first transistor formed at a substrate, a first gate of the first transistor receiving an input signal, one of a first source and drain thereof being connected to a first power supply terminal, and the other thereof being connected to an internal node; and
a second transistor formed at the substrate, a second gate of the second transistor being connected to a second power supply terminal, one of a second source and drain thereof being connected to an input/output node, and the other thereof being connected to the internal node,
wherein a first conductivity type well is formed in the top surface of the substrate with the second source and drain, and an insulating film is formed to cover the side and lower surfaces of the first conductivity type well, and
the first conductivity type well has the same potential as the internal node.

5. The input/output circuit device of claim 4, wherein the potential of a well at which the first transistor is formed is connected to the first power supply terminal.

6. The input/output circuit device of claim 4, wherein
each of the first source and drain and the second source and drain has an n conductivity type,
a ground voltage is applied to the first power supply terminal, and a power supply voltage is applied to the second power supply terminal.

7. An input/output circuit device comprising:
a first transistor formed at a substrate, a first gate of the first transistor receiving an input signal, one of a first source and drain thereof being connected to a first power supply terminal, and the other thereof being connected to an internal node; and
a second transistor formed at the substrate, a second gate of the second transistor being connected to a second power supply terminal, one of a second source and drain thereof being connected to an input/output node, and the other thereof being connected to the internal node,
wherein a first conductivity type well is formed in the top surface of the substrate with the second source and drain, and a second conductivity type well is formed to cover the side and lower surfaces of the first conductivity type well, and
the first conductivity type well has an electrically floating potential.

8. The input/output circuit device of claim 7, wherein
the potential of a well at which the first transistor is formed is connected to the first power supply terminal.

9. The input/output circuit device of claim 7, wherein
each of the first source and drain and the second source and drain has an n conductivity type,
a ground voltage is applied to the first power supply terminal, and a power supply voltage is applied to the second power supply terminal.

10. The input/output circuit device of claim 7, wherein
the substrate is the first conductivity type, and
the first transistor and the second transistor are electrically isolated from each other by the second conductivity type well formed inside the substrate.

11. An input/output circuit device comprising:
a first transistor formed at a substrate, a first gate of the first transistor receiving an input signal, one of a first source and drain thereof being connected to a first power supply terminal, and the other thereof being connected to an internal node; and
a second transistor formed at the substrate, a second gate of the second transistor being connected to a second power supply terminal, one of a second source and drain thereof being connected to an input/output node, and the other thereof being connected to the internal node,
wherein a first conductivity type well is formed in the top surface of the substrate with the second source and drain, and a second conductivity type well is formed to cover the side and lower surfaces of the first conductivity type well, and
the first conductivity type well has the same potential as the internal node.

12. The input/output circuit device of claim 11, wherein
the potential of a well at which the first transistor is formed is connected to the first power supply terminal.

13. The input/output circuit device of claim 11, wherein
each of the first source and drain and the second source and drain has an n conductivity type,
a ground voltage is applied to the first power supply terminal, and a power supply voltage is applied to the second power supply terminal.

14. The input/output circuit device of claim 11, wherein
the substrate is the first conductivity type, and
the first transistor and the second transistor are electrically isolated from each other by the second conductivity type well formed inside the substrate.

* * * * *